United States Patent
Torres et al.

(10) Patent No.: US 10,847,483 B2
(45) Date of Patent: Nov. 24, 2020

(54) INTEGRATED CIRCUITS WITH CONDUCTIVE BUMPS HAVING A PROFILE WITH A WAVE PATTERN

(71) Applicant: TEXAS INSTRUMENTS INCORPORATED, Dallas, TX (US)

(72) Inventors: Jose Daniel Carlos Torres, Angeles (PH); Ruby Ann Merto Camenforte, Mabalacat (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/116,094

(22) Filed: Aug. 29, 2018

(65) Prior Publication Data
US 2020/0075523 A1 Mar. 5, 2020

(51) Int. Cl.
| | |
|---|---|
| *H01L 23/00* | (2006.01) |
| *H01L 23/31* | (2006.01) |
| *H01L 23/495* | (2006.01) |
| *H01L 21/56* | (2006.01) |
| *H01L 21/48* | (2006.01) |

(52) U.S. Cl.
CPC .......... *H01L 24/13* (2013.01); *H01L 21/4825* (2013.01); *H01L 21/563* (2013.01); *H01L 23/3157* (2013.01); *H01L 23/4952* (2013.01); *H01L 23/562* (2013.01); *H01L 24/11* (2013.01); *H01L 24/16* (2013.01); *H01L 24/73* (2013.01); *H01L 2224/11462* (2013.01); *H01L 2224/13018* (2013.01); *H01L 2224/13026* (2013.01); *H01L 2224/13147* (2013.01); *H01L 2224/16245* (2013.01); *H01L 2224/73203* (2013.01); *H01L 2924/35121* (2013.01)

(58) Field of Classification Search
CPC ..... H01L 24/13; H01L 24/11; H01L 23/4952; H01L 24/16; H01L 2224/73203
See application file for complete search history.

(56) References Cited

U.S. PATENT DOCUMENTS

| | | | |
|---|---|---|---|
| 7,327,017 B2 | 2/2008 | Sirinorakul et al. | |
| 2008/0224283 A1* | 9/2008 | Pu ....................... | H01L 23/3107 257/673 |
| 2009/0294932 A1* | 12/2009 | Sahasrabudhe ... | H01L 23/49503 257/666 |
| 2010/0163292 A1* | 7/2010 | Tsai ........................ | H01L 24/05 174/261 |
| 2013/0249071 A1* | 9/2013 | Yao ........................ | H01L 21/561 257/676 |
| 2015/0115422 A1* | 4/2015 | Jeon, II ............. | H01L 23/49541 257/673 |
| 2016/0013121 A1* | 1/2016 | Dix ..................... | H01L 23/4824 257/673 |
| 2016/0118365 A1* | 4/2016 | Singh .................... | H01L 24/97 257/676 |
| 2016/0260656 A1* | 9/2016 | Hwang ............. | H01L 23/49503 |

* cited by examiner

*Primary Examiner* — Thanh Y. Tran
(74) *Attorney, Agent, or Firm* — Dawn Jos; Charles A. Brill; Frank D. Cimino

(57) ABSTRACT

An article of manufacture comprises: an integrated circuit having a contact; a conductive bump electrically coupled to the contact, the conductive bump having a profile with a wave pattern; a lead frame electrically coupled to the conductive bump; and an integrated circuit package mold, the integrated circuit package mold covering portions of the conductive bump and the lead frame.

15 Claims, 7 Drawing Sheets

INTEGRATED CIRCUITS WITH CONDUCTIVE BUMPS HAVING A PROFILE WITH A WAVE PATTERN

BACKGROUND

In many instances of packaging integrated circuits, for example, integrated circuits for high current power applications, a packaged integrated circuit includes conductive bumps to provide electrical connection from a lead frame to various contacts or pads on the integrated circuit. Mold compound is formed to surround the conductive bumps, and provides protection to the integrated circuit.

SUMMARY

In accordance with at least one example of the disclosure, an article of manufacture comprises: an integrated circuit having a contact; a conductive bump electrically coupled to the contact, the conductive bump having a profile with a wave pattern; a lead frame electrically coupled to the conductive bump; and an integrated circuit package mold, the integrated circuit package mold covering portions of the conductive bump and the lead frame.

In accordance with at least one example of the disclosure, a method comprises: depositing a first film resist on a substrate, the substrate including an integrated circuit with a contact; illuminating the first film resist with radiation and etching the first film resist to provide a first opening; providing a metal into the first opening to electrically couple with the contact; stripping away the first film resist after providing the metal in the first opening; depositing a second film resist on the substrate and on the metal provided into the first opening; illuminating the second film resist with radiation and etching the second film resist to provide a second opening, the second opening different in size than the first opening; providing the metal into the second opening; and stripping away the second film resist after providing the metal into the second opening.

In accordance with at least one example of the disclosure, a method comprises: depositing a first dry film resist on a substrate, the substrate including an integrated circuit with a contact; patterning and etching the first dry film resist to provide a first opening to the contact; depositing a second dry film resist on the substrate and on the first dry film resist; patterning and etching the second dry film resist to provide a second opening to the contact by way of the first opening, wherein the second opening is different in size than the first opening; and providing a metal through the second opening and the first opening to electrically couple to the contact.

BRIEF DESCRIPTION OF THE DRAWINGS

For a detailed description of various examples, reference will now be made to the accompanying drawings in which.

DETAILED DESCRIPTION

In some packaged integrated circuits, conductive bumps are formed to provide electrical connection from a lead frame to various contacts or pads on the integrated circuit. In some applications, the conductive bumps may decouple (delaminate) from the packaged integrated circuit mold, or cracks may form in the conductive bumps. This can increase the on-resistance of the conductive bumps. Embodiments mitigate these problems by fabricating the conductive bumps to have a profile that has a wave or interlocking pattern, thereby providing improved mechanical coupling to the surrounding packaged integrated circuit mold.

Figure 1A:
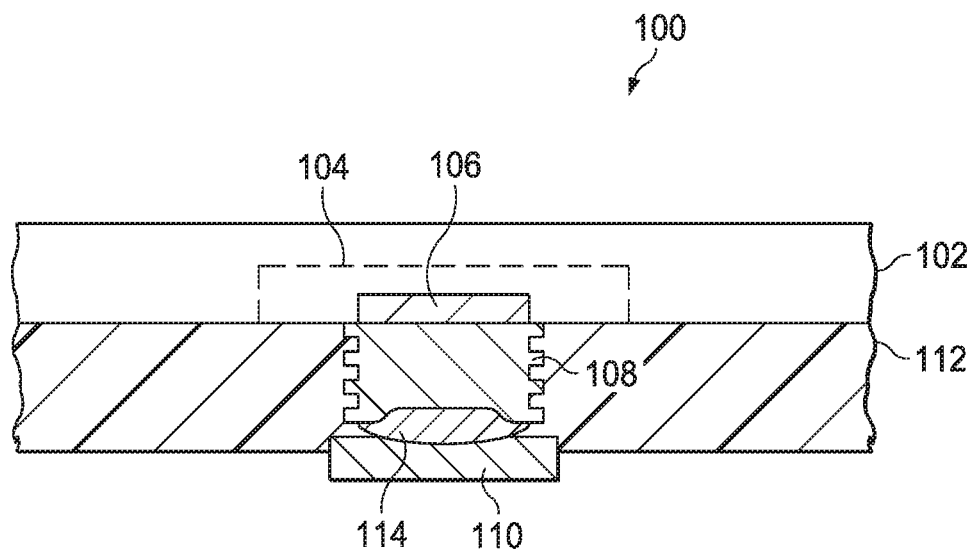
FIG. 1A shows a packaged integrated circuit in accordance with various examples.

FIG. 1A depicts an article of manufacture, specifically an illustrative packaged integrated circuit 100, comprising a substrate 102, such as a silicon substrate. Formed in the substrate 102 is an integrated circuit 104 having a contact 106. The contact 106 can be, for example, a pad or a via electrically coupled to one or more circuit elements (not shown) within the integrated circuit 104.

The illustrative packaged integrated circuit 100 further comprises a conductive bump 108 electrically coupled to the contact 106, and a lead frame 110 electrically coupled to the conductive bump 108. In some embodiments, the conductive bump 108 comprises copper, and is formed by electroplating a metal (e.g., copper) onto the contact 106.

FIG. 1A shows a portion of the lead frame 110, where in practice the lead frame 110 includes a plurality of leads (not shown) electrically coupled to the integrated circuit 104. The illustrative packaged integrated circuit 100 further comprises an integrated circuit package mold 112 surrounding the conductive bump 108 and coupled to the lead frame 110. The illustrative packaged integrated circuit 100 further comprises an electrically conductive adhesive 114 coupling the conductive bump 108 to the lead frame 110.

Figure 1B:
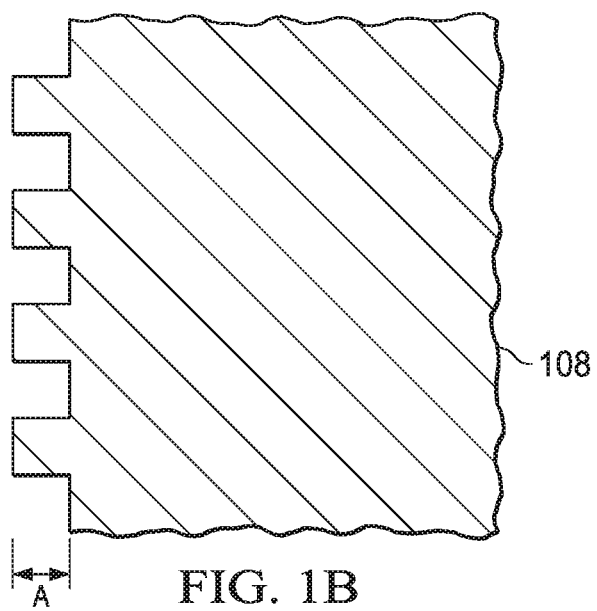
FIG. 1B shows a conductive bump in accordance with various examples.

FIG. 1B depicts the conductive bump 108 having a profile with a wave pattern. This wave pattern is illustrated in cross-sectional view as a simple square wave of amplitude A. In some embodiments, the wave pattern has an amplitude of at least 1 micron. In practice, the wave pattern is not a simple square wave. In some embodiments, the wave pattern can include a complex wave comprised of multiple waves of varying spatial wavelengths. The profile (or wave pattern) may also be described as an interlocking pattern, so that the conductive bump 108 includes extensions projecting from sides of the conductive bump 108 in a direction approximately perpendicular to a plane along a length of the conductive bump 108. The profile of the conductive bump 108 provides good mechanical coupling with the integrated circuit package mold 112 when compared to a smooth profile, partly due to the increased surface area of contact. The wave pattern mitigates separation of the conductive bump 108 from the integrated circuit package mold 112, and mitigates the crack formation that can lead to a higher on-resistance.

Figure 6:
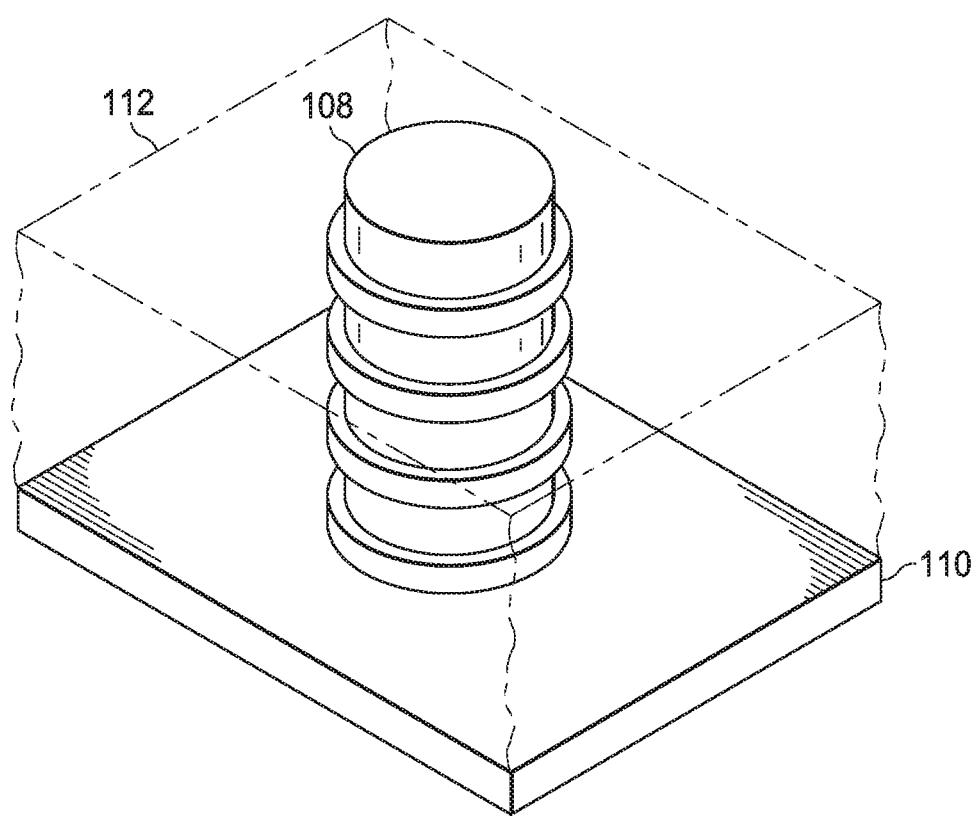
FIG. 6 shows a conductive bump in accordance with various examples.

FIG. 6 depicts a three-dimensional view of the conductive bump 108, showing the integrated circuit package mold 112 covering sides of the conductive bump 108. The conductive bump 108 includes extensions projecting from sides of the conductive bump 108 in a direction approximately perpendicular to a plane along a length of the conductive bump 108. With the integrated circuit package mold 112 formed to cover the sides of the conductive bump 108, the shape of the interface of the integrated circuit package mold 112 with the conductive bump 108 has a wave pattern complementary to the wave pattern of the conductive bump 108. For ease of illustration, FIG. 6 does not show a substrate, the conductive bump 108 is not shown with hidden lines, and FIG. 6 shows slab-like portions of the integrated circuit package mold 112 and the lead frame 110.

The illustrative packaged integrated circuit 100 can be manufactured in several ways to provide the conductive bump 108 having a profile with a wave or interlocking pattern with some desired amplitude. In some embodiments, to manufacture the conductive bump 108, a film resist is deposited on the substrate 102 (on the side having the contact 106). The film resist is illuminated with radiation to define a pattern for an opening to the contact 106. The film resist is illuminated so that there is a standing wave of radiation in the film resist. After illumination, the film resist is etched to provide an opening to the contact 106, and metal is electroplated to the contact 106 to form the conductive bump 108. Because of the standing wave, the opening into which the conductive bump 108 is formed has a wave pattern, so that the conductive bump 108 is formed with a profile having a wave pattern. Other methods of manufacture are described below.

Figure 2:
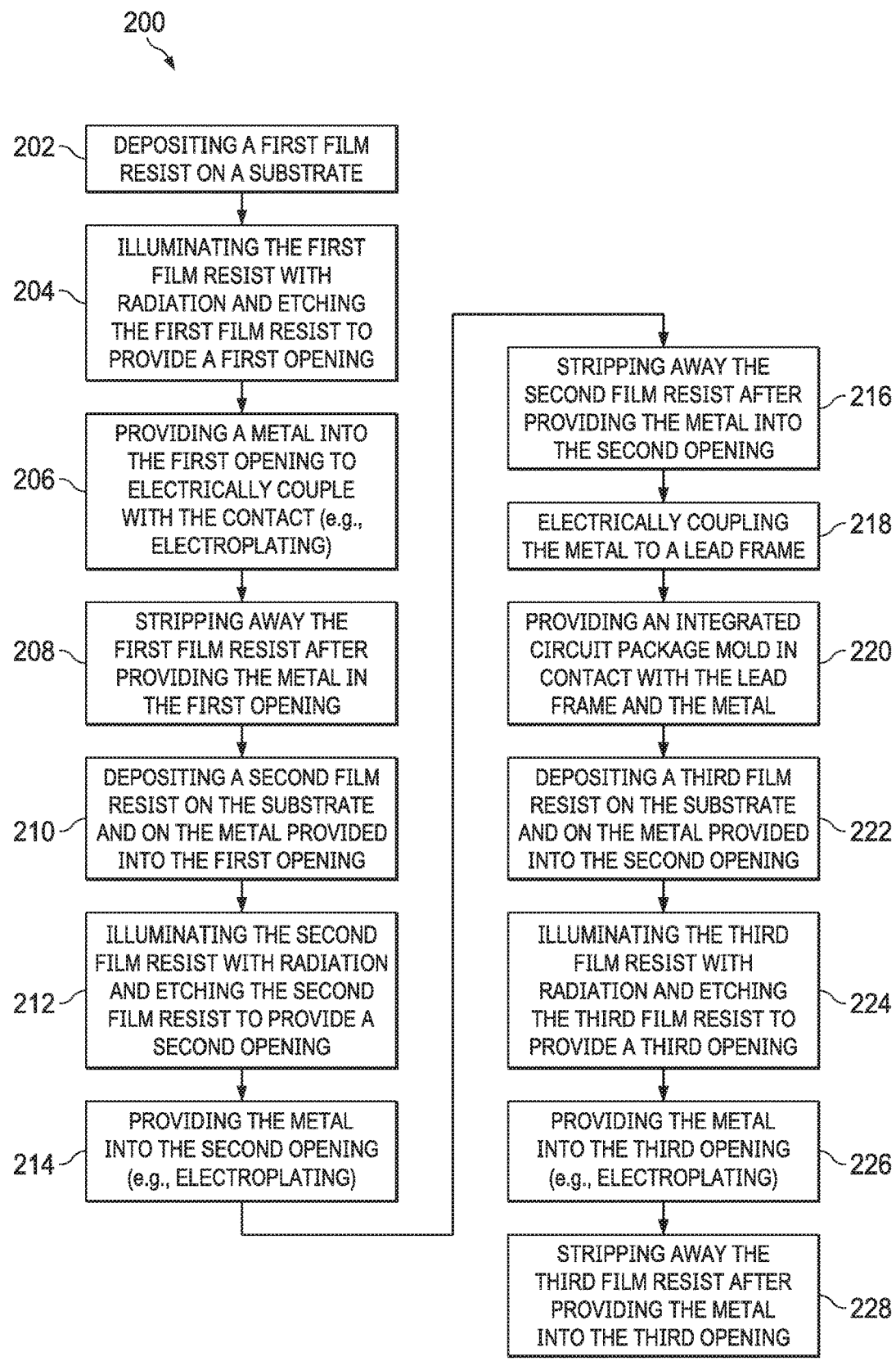
FIG. 2 shows a method in accordance with various examples.

FIG. 2 depicts an illustrative method 200 to manufacture the conductive bump 108. The illustrative method 200 comprises: in step 202, depositing a first film resist on a substrate, the substrate including an integrated circuit with a contact; in step 204, illuminating the first film resist with radiation and etching the first film resist to provide a first opening; in step 206, providing a metal into the first opening to electrically couple with the contact; in step 208, stripping away the first film resist after providing the metal in the first opening; in step 210, depositing a second film resist on the substrate and on the metal provided into the first opening; in step, 212, illuminating the second film resist with radiation and etching the second film resist to provide a second opening, the second opening different in size than the first opening; in step 214, providing the metal into the second opening; and in step 216, stripping away the second film resist after providing the metal into the second opening.

The illustrative method 200 further comprises: in step 218, electrically coupling the metal to a lead frame; and in step 220, providing an integrated circuit package mold in contact with the lead frame and the metal.

In some embodiments, the step 206 of providing the metal into the first opening and the step 214 of providing the metal into the second opening comprises electroplating. In some embodiments, the metal comprises copper.

Steps 202 through 216 can be repeated to build up additional layers of the conductive bump 108 before completing steps 218 and 220. As an example, the illustrative method 200 further comprises: in step 222, depositing a third film resist on the substrate and on the metal provided into the second opening; in step 224, illuminating the third film resist with radiation and etching the third film resist to provide a third opening, the third opening different in size than the second opening; in step 226, providing the metal into the third opening; and in step 228, stripping away the third film resist after providing the metal into the third opening. In some embodiments, the step 226 of providing the metal into the third opening comprises electroplating.

In the illustrative method 200, for some embodiments the second opening may be smaller in size than the first and third openings, whereas in other embodiments the second opening may be greater in size than the first and third openings. The first and third openings may have the same size. In practice, embodiments can have more than three openings. The sequence of openings defines a wave or interlocking pattern in the interface of the conductive bump 108 with the packaged integrated circuit mold 112.

Figure 3A:
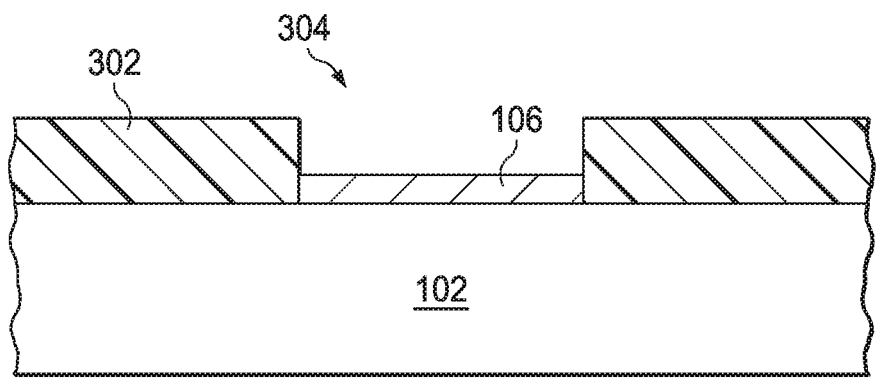
FIG. 3A shows results of processing steps in accordance with various examples.
Figure 3B:
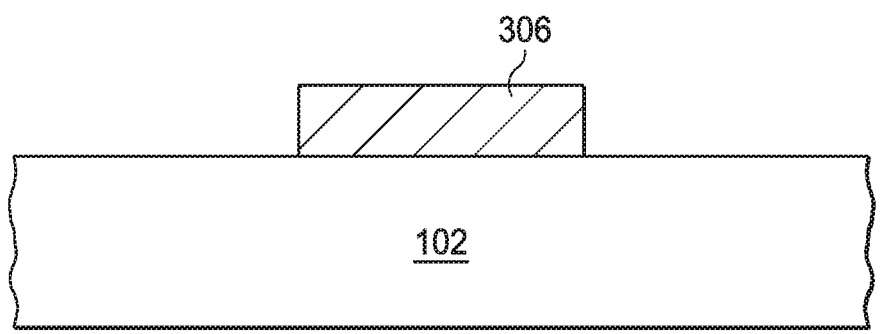
FIG. 3B shows results of processing steps in accordance with various examples.

FIG. 3A through FIG. 3F depicts some of the steps in the illustrative method 200 to fabricate the illustrative packaged integrated circuit 100. FIG. 3A depicts a first film resist 302 deposited on the substrate 102, where the first film resist 302 has been illuminated and etched to provide a first opening 304 to the contact 106. In FIG. 3B, metal is provided through the first opening 304 to electrically couple to the contact 106, where the first film resist 302 and excess metal is stripped away. In some embodiments, copper is electroplated to the contact 106. The resulting metal, a precursor to the conductive bump 108, is labeled 306.

Figure 3C:
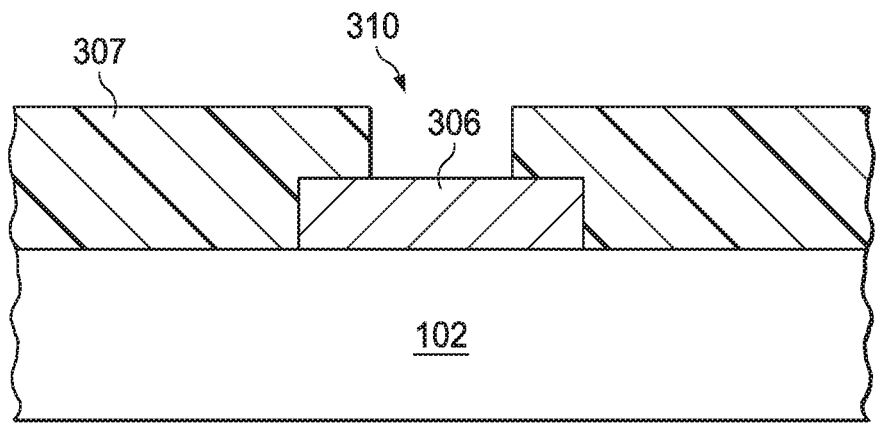
FIG. 3C shows results of processing steps in accordance with various examples.
Figure 3D:
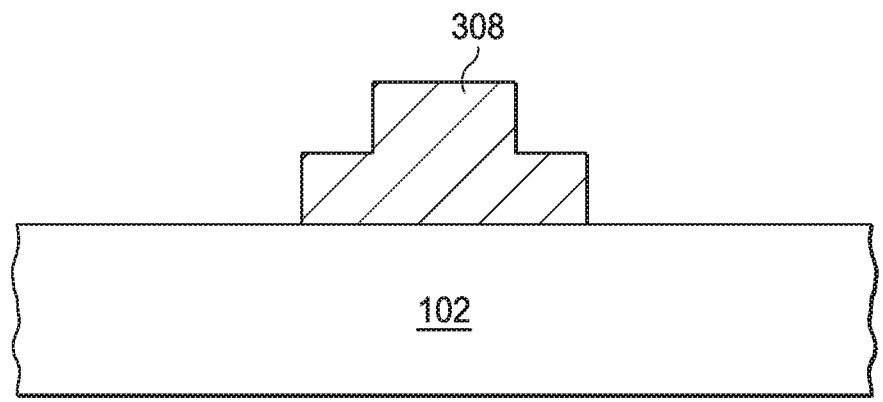
FIG. 3D shows results of processing steps in accordance with various examples.

In FIG. 3C, a second film resist 307 is deposited on the substrate 102 and over part of the metal 306, where the second film resist 307 has been illuminated and etched to provide a second opening 310 to the metal 306. In FIG. 3D, metal is provided through the second opening 310 to electrically couple to the metal 306, where the second film resist 307 and excess metal is stripped away. The resulting metal, a precursor to the conductive bump 108, is labeled 308.

Figure 3E:
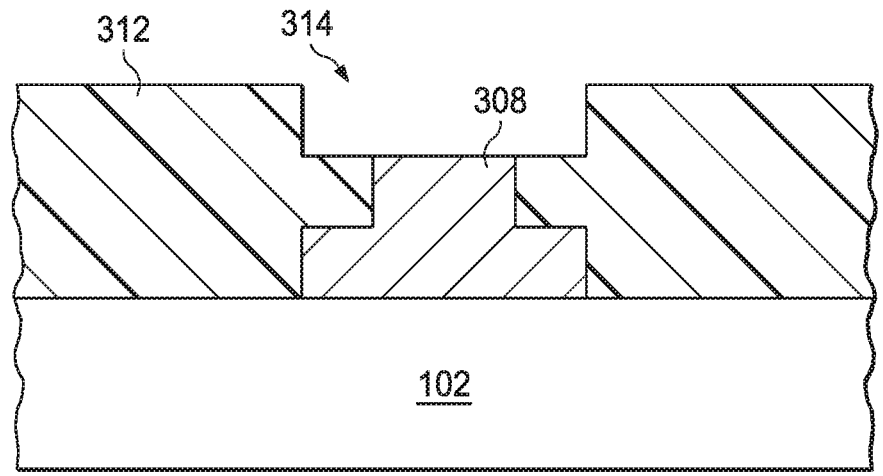
FIG. 3E shows results of processing steps in accordance with various examples.
Figure 3F:
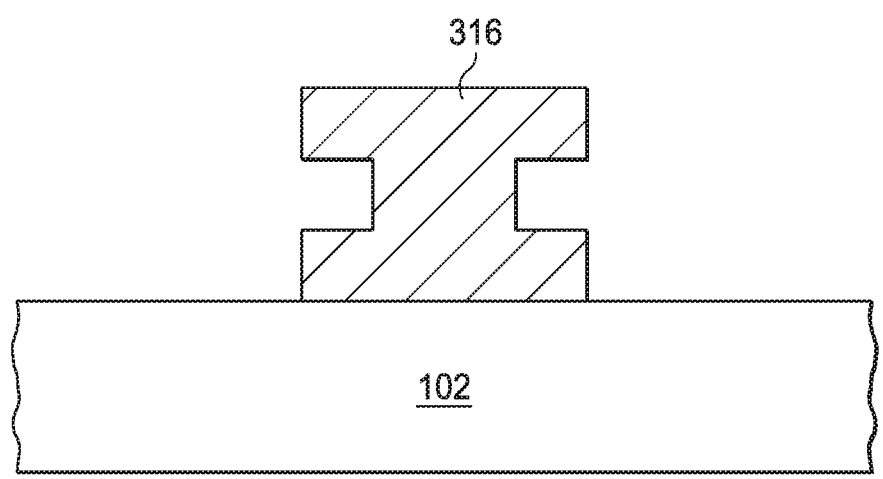
FIG. 3F shows results of processing steps in accordance with various examples.

In FIG. 3E, a third film resist 312 is deposited on the substrate 102 and over part of the metal 308, where the third film resist 312 has been illuminated and etched to provide a third opening 314 to the metal 308. In FIG. 3F, metal is provided through the third opening 314 to electrically couple to the metal 308, where the third film resist 312 and excess metal is stripped away. The resulting metal, a precursor to the conductive bump 108, is labeled 316.

The steps outlined in FIG. 3A through FIG. 3F are repeated to build up the conductive bump 108 having a profile that may be described as a wave or an interlocking pattern as discussed with respect to the previous drawings. This profile facilitates mechanical coupling of the conductive bump 108 to the packaged integrated circuit mold 112. This mechanical coupling mitigates the conductive bump 108 from decoupling (delaminating) from the packaged integrated circuit mold 112, and mitigates crack formation in the conductive bump 108.

Figure 4:
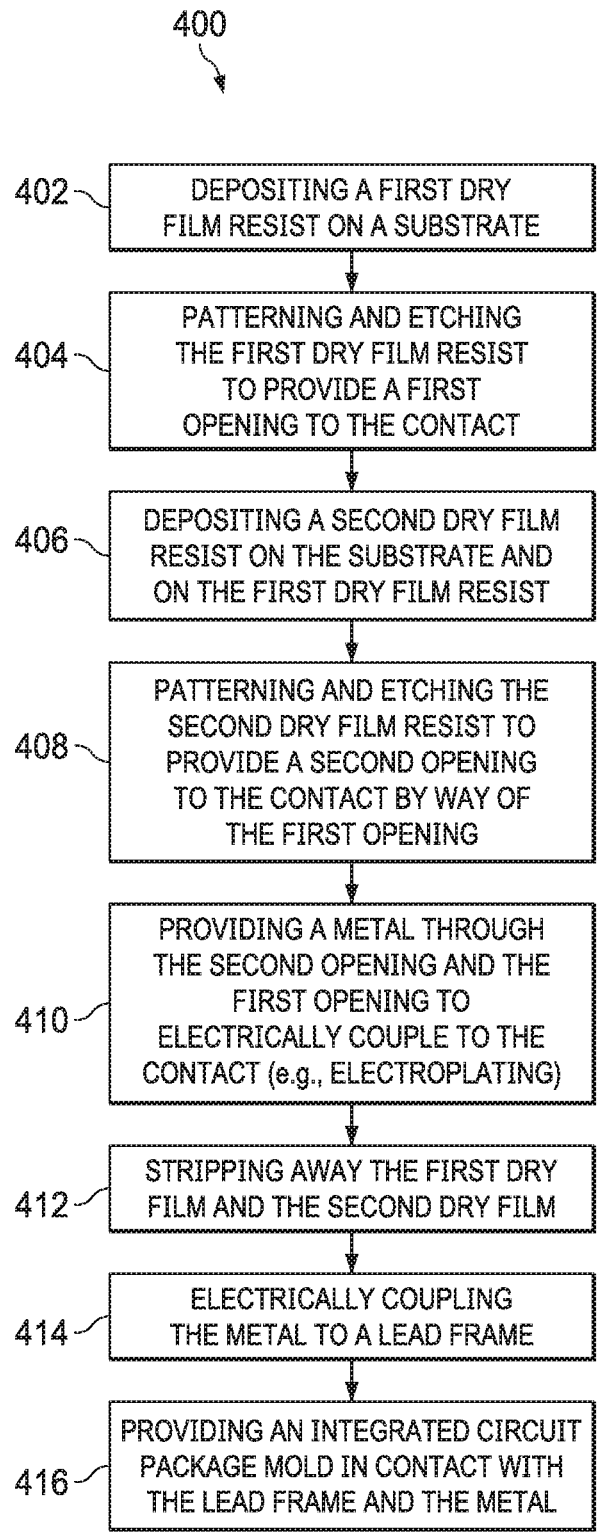
FIG. 4 shows a method in accordance with various examples.

FIG. 4 depicts an illustrative method 400 to manufacture the conductive bump 108. The illustrative method 400 comprises: in step 402, depositing a first dry film resist on a substrate; in step 404, patterning and etching the first dry film resist to provide a first opening to the contact; in step 406, depositing a second dry film resist on the substrate and on the first dry film resist; in step 408, patterning and etching the second dry film resist to provide a second opening to the contact by way of the first opening; and in step 410, providing a metal through the second opening and the first opening to electrically couple to the contact. In some embodiments, providing the metal through the second opening and the first opening to electrically couple to the contact comprises electroplating the metal.

In some embodiments, the illustrative method 400 further comprises: in step 412, stripping away the first dry film and the second dry film; and in step 414, electrically coupling the metal to a lead frame. In some embodiments, the illustrative method 400 further comprises, in step 416, providing an integrated circuit package mold in contact with the lead frame and the metal.

In practice, steps 402 through 408 are repeated before performing the step 410, so that multiple dry film resists are deposited, each one patterned and etched so as to provide a sequence of openings. The sequence of openings alternate in size, so that a wave or interlocking pattern is formed before performing the step 410 in which metal is provided through the openings to electrically couple to the contact.

Figure 5A:
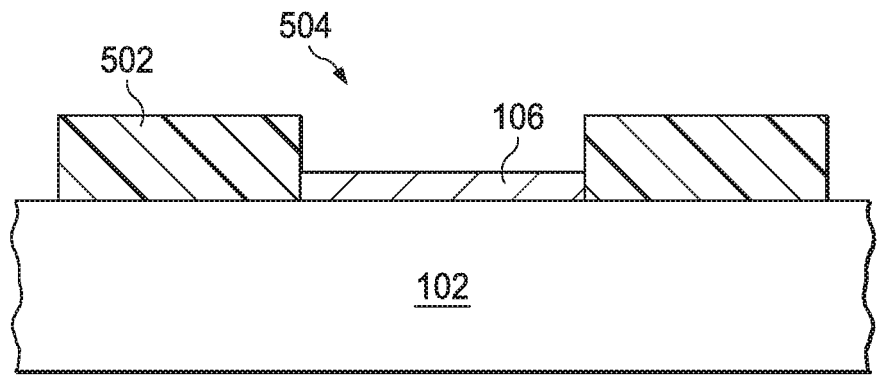
FIG. 5A shows results of processing steps in accordance with various examples.
Figure 5B:
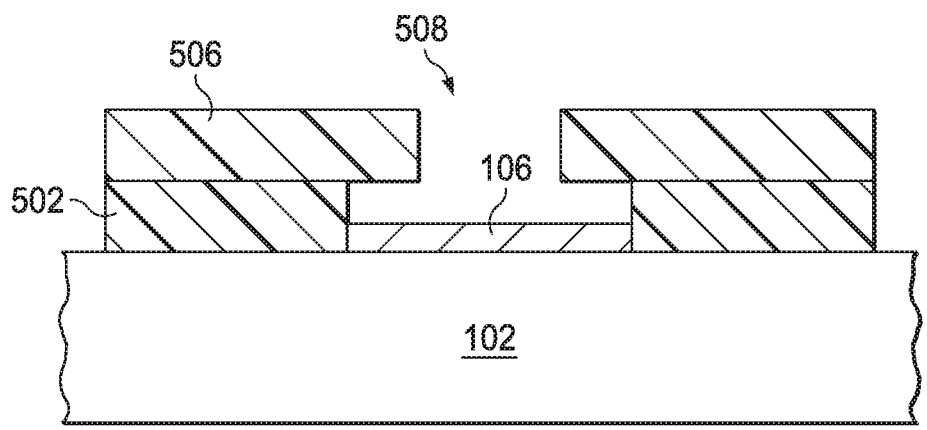
FIG. 5B shows results of processing steps in accordance with various examples.

FIG. 5A and FIG. 5B depicts some of the steps in the illustrative method 400 to fabricate the illustrative packaged integrated circuit 100. In FIG. 5A, a first dry film resist 502 is deposited on the substrate 102, followed by patterning and etching to provide a first opening 504 to the contact 106. In FIG. 5B, a second dry film resist 506 is deposited, followed by patterning and etching to provide a second opening 508 to the contact 106. As described with respect to the illustrative method 400 of FIG. 4, the steps illustrated in FIG. 5A and FIG. B can be repeated to provide a sequence of openings to define a profile having a wave or interlocking pattern, followed by electroplating a metal to the contact 106 to fabricate the conductive bump 108.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An article of manufacture comprising:
   an integrated circuit having a contact;
   a conductive bump directly attached to the contact, the conductive bump having a profile with a wave pattern;
   a lead frame electrically coupled to the conductive bump; and
   an integrated circuit package mold, the integrated circuit package mold covering portions of the conductive bump and the lead frame.

2. The article of manufacture of claim 1, further comprising:
   an electrically conductive adhesive coupling the conductive bump to the lead frame.

3. The article of manufacture of claim 1, wherein the conductive bump comprises copper.

4. The article of manufacture of claim 1, wherein the conductive bump is electroplated to the contact.

5. The article of manufacture of claim 1, wherein the contact is a pad or a via.

6. The article of manufacture of claim 1, wherein the conductive bump includes extensions projecting from sides of the conductive bump in a direction approximately perpendicular to a plane along a length of the conductive bump.

7. The article of manufacture of claim 1, wherein the wave pattern has an amplitude of at least 1 micron.

8. An integrated circuit package comprising:
   an integrated circuit having a contact;
   a bump directly attached to the contact, the bump including a wave pattern from a cross-sectional view of the package;
   a lead electrically coupled to the bump; and
   a package mold covering portions of the bump and the lead.

9. The package of claim 8, further comprising:
   an electrically conductive adhesive coupling the bump to the lead.

10. The package of claim 8, wherein the bump is electroplated to the contact.

11. The package of claim 8, wherein the contact is a pad or a via.

12. The package of claim 8, wherein the bump includes extensions projecting from sides of the bump in a direction approximately perpendicular to a plane along a length of the bump.

13. An integrated circuit package comprising:
   an integrated circuit having a contact;
   a bump directly attached to the contact, the bump including extensions projecting from sides of the bump, each of the extensions including a right-angled edge;
   a lead electrically coupled to the bump; and
   a package mold covering portions of the bump and the lead.

14. The package of claim 13, wherein each of the extensions extends in a direction approximately perpendicular to a plane along a length of the bump.

15. The package of claim 13, wherein each of the extensions includes a height of at least 1 micron.

* * * * *